US010692967B1

(12) United States Patent
Chen et al.

(10) Patent No.: US 10,692,967 B1
(45) Date of Patent: Jun. 23, 2020

(54) HIGH DENSITY SELF-ROUTING METAL-OXIDE-METAL CAPACITOR

(71) Applicant: Analog Devices, Inc., Norwood, MA (US)

(72) Inventors: Baozhen Chen, Woburn, MA (US); Lalinda D. Fernando, Westford, MA (US); Micah Galletta O'Halloran, Andover, MA (US); Andrew Wayne Shaw, Dorchester, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/209,768

(22) Filed: Dec. 4, 2018

(51) Int. Cl.
*H01L 49/02* (2006.01)
*H01L 27/02* (2006.01)

(52) U.S. Cl.
CPC .......... *H01L 28/86* (2013.01); *H01L 27/0207* (2013.01); *H01L 28/60* (2013.01); *H01L 28/75* (2013.01)

(58) Field of Classification Search
CPC ....... H01L 21/64; H01L 21/70; H01L 21/702; H01L 21/71
See application file for complete search history.

(56) References Cited

U.S. PATENT DOCUMENTS

2008/0239619 A1* 10/2008 Okamoto ............... H01G 4/005
361/303

2012/0092806 A1 4/2012 Hua et al.
2012/0286393 A1 11/2012 Lin et al.

FOREIGN PATENT DOCUMENTS

CN 107633128 A 1/2018
KR 101585959 B1 1/2016

OTHER PUBLICATIONS

"20-Bit, 1Msps, Low Power SAR ADC with 0.5ppm INL", LTC2378-20, 28 pgs.
Chen, Baozhen, "Notes for APD6554 patent meeting Oct. 5, 2018", Power Point Presentation, (Oct. 05, 2018), 15 pgs.

* cited by examiner

*Primary Examiner* — Cheung Lee
(74) *Attorney, Agent, or Firm* — Schwegman Lundberg & Woessner, P.A.

(57) ABSTRACT

A self-routing capacitor for an integrated circuit having: a first electrode comprising a first base region and a first finger, the first finger extending from a wall of the first base region in a first direction; a second electrode comprising a second base region and a second finger; the second finger extending from a wall of the second base region in a second direction substantially parallel to and opposing the first direction, the second finger coupled to the first finger; a third electrode comprising a third base region and a third finger, the third finger extending from a first wall of the third base in the second direction; and a fourth electrode comprising a fourth finger, the fourth finger extending from a second wall of the third base region in the first direction. The capacitor being coupled to other metal layers through a base region of an electrode.

24 Claims, 7 Drawing Sheets

HIGH DENSITY SELF-ROUTING METAL-OXIDE-METAL CAPACITOR

FIELD OF THE DISCLOSURE

This document pertains generally, but not by way of limitation, to semiconductor devices, and more particularly, to techniques for constructing a self-routing capacitor for an integrated circuit.

BACKGROUND

Capacitors are often used in integrated circuits for their role in constructing devices that capture, process, and store electrical signals. Metal-oxide-metal (MOM) capacitors are an example of a capacitor structure that is commonly used in integrated circuit designs. The capacitance, or charge storing ability, of MOM capacitors is typically determined by the side-wall capacitance of metal fingers laterally disposed on a plane in a layer of an integrated circuit. This structure of MOM capacitors adds flexibility to the design of integrated circuits, such as by facilitating routing between capacitor plates and the stacking of capacitors in two or more layers of an integrated circuit.

A task of integrated circuit designers is to continually reduce the size of these circuits, such as by shrinking the size of their constituent components, or by more densely packing these components together. The integrated circuit area used by a MOM capacitor can be reduced by decreasing the width of the fingers of these devices or by reducing the spacing between such fingers. The ability to reduce the width of, or the spacing between, fingers of an MOM capacitor can be limited by vias disposed in these structures, such as for coupling electrodes or plates of a MOM capacitor to other circuit components. Such vias, for example, may impose limit the minimum distance between a wall of a finger and an edge of a via. Violating such limits may cause a circuit design to fail design rules meant to ensure the quality of a process used to fabricate integrated from such circuit designs.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present disclosure describes, among other things, a self-routing metal-oxide-metal (MOM) capacitor (hereinafter, "self-routing capacitor") for use in an integrated circuit. The structure of this capacitor can reduce the area used by a given capacitor in an integrated circuit, such as by enabling connections to be made to each plate of a capacitor without the need to add vias to the fingers of the capacitor, thereby enabling the width of a given finger to be reduced to the technology node, or process technology, of the integrated circuit. Accordingly, this self-routing capacitor can reduce the size and cost of an integrated circuit or enable greater functionality to be incorporated into such circuits.

As used herein, the term "width" refers to the smallest non-zero dimension indicated in the figures of a device, circuit structure, or circuit element. The term "length" refers to the largest non-zero dimension indicated in the figures of a device, circuit structure, or circuit element.

Although the terms "top plate" and "bottom plate" are used herein to refer to specific electrodes of the self-routing capacitors described in the present disclosure, such references are only used for illustrative purposes and do not denote any, particular order of configuration of the electrodes of such capacitors. Accordingly, the terms "top plate" and "bottom place" can be used interchangeably without detracting from the novelty, structure, or utility of the present disclosure.

Figure 1:
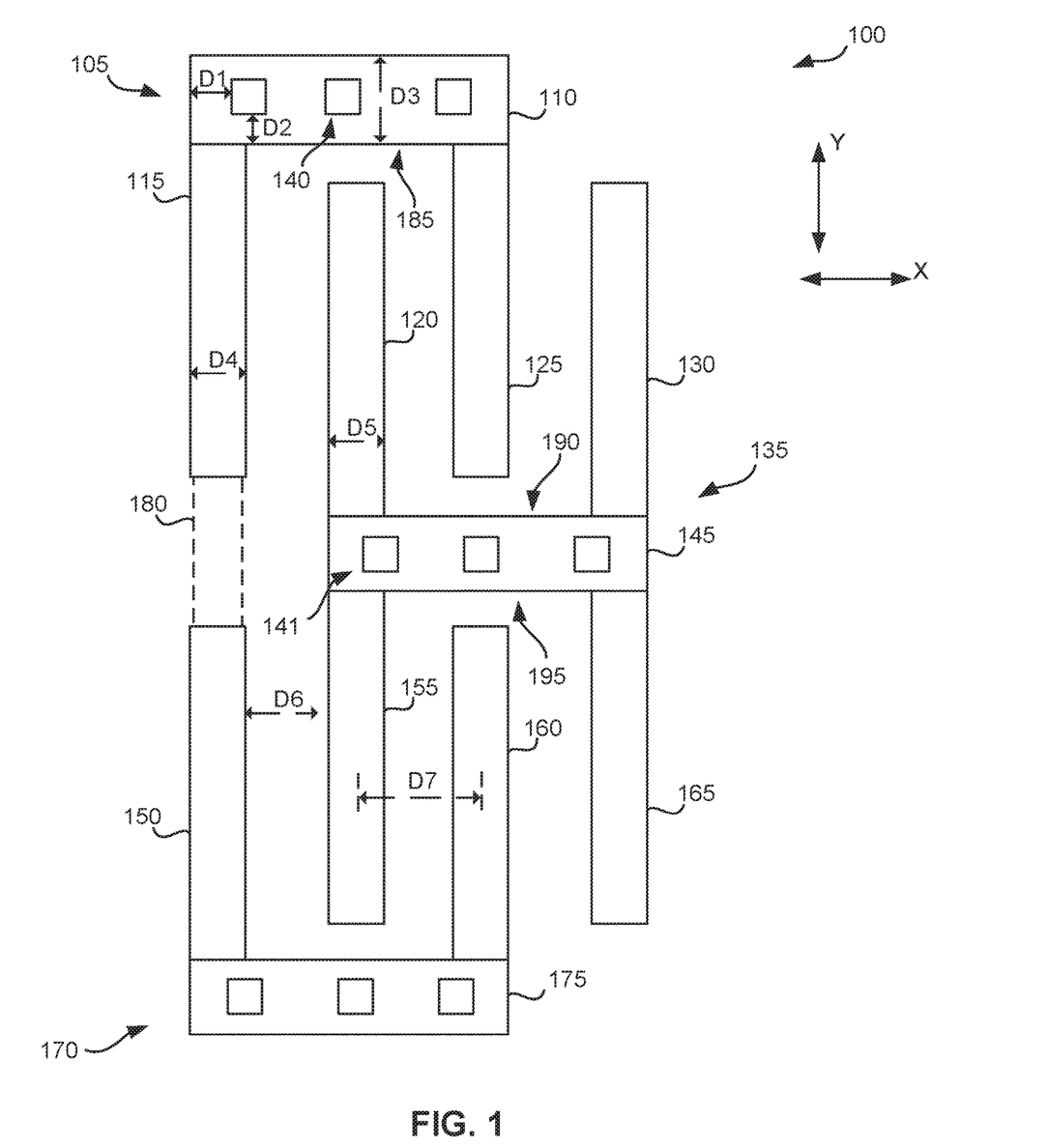
FIG. 1 illustrates an example of a self-routing capacitor, according to various examples of the present subject matter.

FIG. 1 illustrates an example of a self-routing capacitor 100, according to various examples of the present subject matter. The self-routing capacitor 100 can include a first electrode 105, a second electrode 135, and a third electrode 170. The self-routing capacitor 100 can be an example of a MOM capacitor having a bottom plate corresponding to the first electrode 105 and the third electrode 170, and a top plate corresponding to the second electrode 135. Each electrode of the self-routing capacitor 100 can be formed in an indicated metal layer of an integrated circuit. A dielectric material (not shown) having an indicated permittivity can be dispose between the electrodes, and appropriate shielding or insulating layers (not shown) can be disposed above or below the electrodes, according to various integrated circuit fabrication techniques.

The first electrode 105 can include a first base region 110 and a first set (e.g., two or more) of fingers 115 and 125. The first base region 110 can include one or more vias 140, such as for coupling the self-routing capacitor 100 to one or more layers, or components, of an integrated circuit. Such layers or components can include other capacitors, or other active or passive electrical components. The vias 140 can limit the minimum attainable size of the of the first base region 110, such as by forcing the first base region to be at least a large as required to ensure that design rules for the minimum distance D1 or D2 from a via 140 to a wall of the first base region is satisfied or passed. In some examples, the width D3 of the first design region 110 can be determined by the distance D2 and the size of the vias 140. The width D3 can be larger than the minimum attainable width for an electrode without a via in an indicated process node.

The first set of fingers 115 and 125 can be coupled, or physically connected, to a wall 185 of the first base region 110 and can extend away from the first base region in a direction that is substantially parallel to an axis Y. In some examples, each finger of the first set of fingers 115 and 125 can be coupled to the wall 185 of the first base region 110 at opposite ends, or edges, of the first base region. In other examples, one or more finger of the first set of fingers 115 and 125 can be coupled to the wall 185 of the base region 110 at an indicated distance from an end of the first base region. The sidewalls (not shown) of the first set of fingers 115 and 125 can contribute to the area of the bottom plate of the self-routing capacitor 100.

The second electrode 135 can include a second base region 145 and a second set of fingers 120 and 130. In some examples, the second base region 145 can be substantially similar to the first base region 110 with regard to size, shape, and constituent material composition. The second base region 145 can include one or more vias 141, such as for coupling the self-routing capacitor 100 to one or more layers, or components, of an integrated circuit. The second set fingers 120 and 130 can be coupled to a first wall 190 of the second base region 145, such as to form fingers of a top plate of the self-routing capacitor 100. Such second set of fingers 120 and 130 can extend away from the first wall 190 in a direction of the electrode 105 along a line that is substantially parallel to the axis Y. The second set of fingers 120 and 130 can be interdigitated with the first set of fingers 115 and 125. Similar to the first set of fingers 115, 125, the sidewalls (not shown) of the second set of fingers 120 and 130 can contribute to the area of the top plate of the self-routing capacitor 100.

The third electrode 170 can include a third base region 175 and a third set of fingers 150 and 160. The third electrode 170 can be an instance, or a substantially identical example of, of the first electrode 105 mirrored or flipped across an axis X. The third electrode 170 can be substantially aligned with the first electrode 105. In some examples, such substantial alignment, can include at least partially overlapping, in a dimension that is substantially parallel to the axis X, a finger of the third set of fingers with a corresponding finger of the first set of fingers. The first electrode 105 can be coupled to the third electrode 170, such as to cause the third electrode to further contribute to the area of the bottom plate of the self-routing capacitor 100. Such coupling can include connecting a finger 115 of the first electrode 105 to a finger 150 of the third electrode 170, such as by using conductor 180. In some examples, the conductor 180 can be formed in a different metal layer than the metal layer in which the electrodes of the capacitor 100 is formed. Such conductor can be coupled to the first electrode 105 and to the third electrode 170 through the one or more vias in the base regions 110 and 175. In certain examples, the conductor 180 can be formed in the same metal layer as the metal layer in which the electrodes of the capacitor 100 are formed. In these examples, the conductor 180 can be coupled to the first electrode 105 to the third electrode 170 in such a metal layer, such as by coupling the conductor 180 to one or more fingers of the first electrode 105 and to one or more fingers of the third electrode 170, such as by coupling the conductor 180 to the finger 115 and to the finger 150. In some examples, the first electrode 105 can be coupled to the third electrode 170 by connecting the first base region 110 to the third base region 175 through a common, or shared, electrode or circuit element.

In some examples, the self-routing capacitor 100 can include a fourth set of fingers 155 and 165. Such fourth set of fingers can be part of a fourth electrode having a base region (not shown) that substantially overlaps, or that is a part of, the second base region. In some examples, such fourth base region can abut the second base region 145, In some examples, the conductor 180 is substantially parallel to a finger of the electrode 105 or a finger of the electrode 170, and can overlap such fingers in an axis X. Each finger of the fourth set of fingers 155 and 165 can be coupled to a second wall 195 of the second base region 145, such as to form additional fingers of the top plate of the self-routing capacitor 100. Such fingers can be interdigitated with the third set of fingers 150 and 160.

In some examples, one or more fingers of the self-routing capacitor 100 can be devoid of vias, such as to enable the width D4 of such finger to be substantially equal to the minimum allowed width for a finger without a via in a process node used to fabricate the self-routing capacitor 100. In some examples, two or more adjacent fingers of the self-routing capacitor 100 can be devoid of vias, such as to enable a pitch (e.g., distance between the center of the two adjacent fingers) D7 between such two fingers to be substantially equal to the minimum allowed pitch between two adjacent fingers without vias in a process node.

As shown in FIG. 1, the base regions of the first electrode 105, the second electrode 135, and the third electrode 170 can include vias 140, 141, and 142, respectively. Such vias can be used to couple each plate of the self-routing capacitor 100 to one or more layers or component of the integrated circuit without the use of vias in the fingers of the self-routing capacitor.

Figure 2:
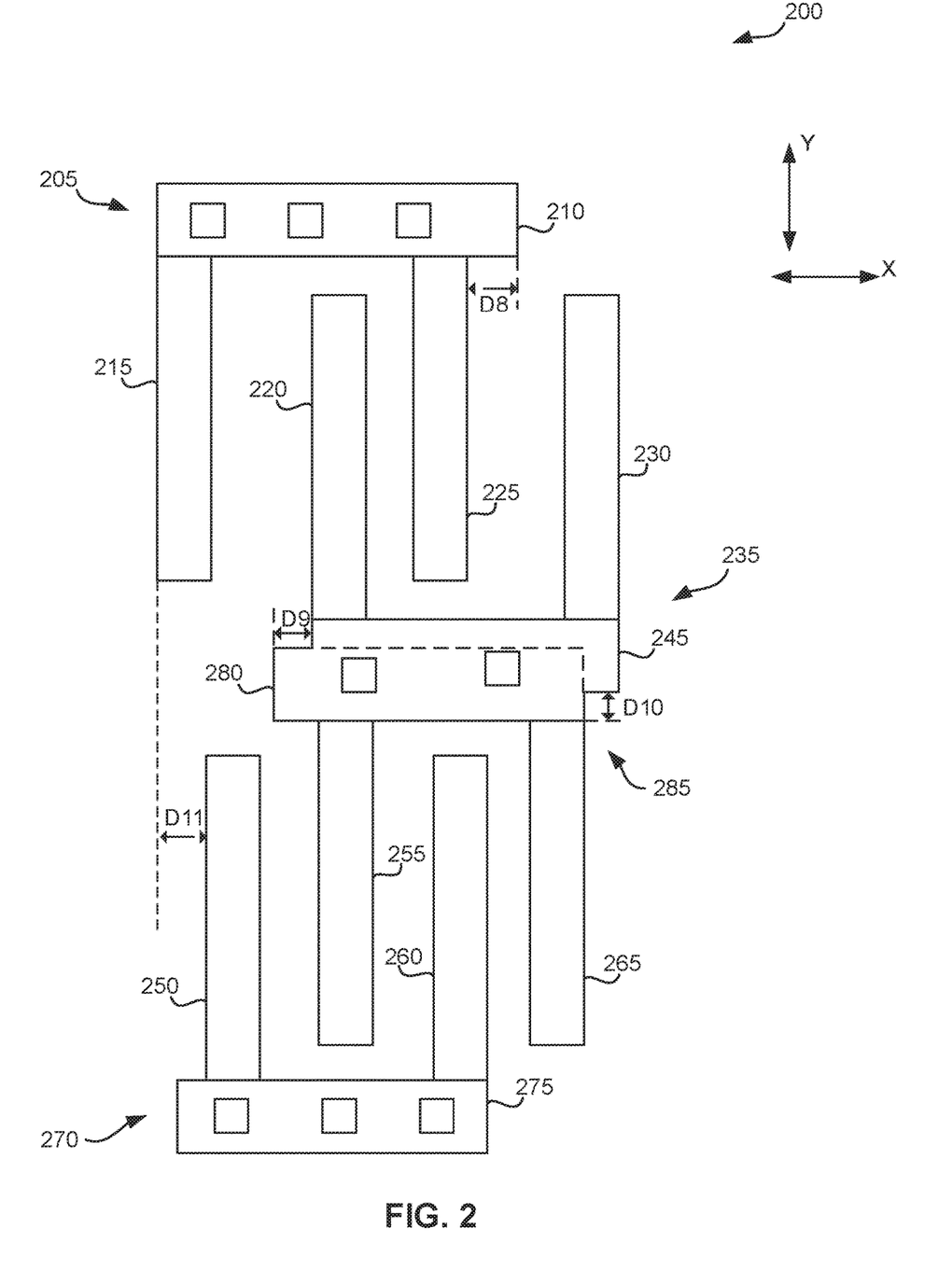
FIG. 2 illustrates an example of aligning elements of a self-routing capacitor, according to an example of the present subject matter.

FIG. 2 illustrates an example of aligning elements of a self-routing capacitor 200, according to examples of the present subject matter. Such aligning can apply to any of the self-routing capacitors described in the present disclosure. Similar to the self-routing capacitor 100, the self-routing capacitor 200 can include a first electrode 205 having a base region 210 and a set of fingers 215 and 225, a second electrode 235 having a base region 245 and a set of fingers 220 and 230, and a third electrode 270 having a base region 275, a set of fingers 250 and 260. The self-routing capacitor 200 can also include a fourth electrode 285 having base region 280 and a set of fingers 255 and 265.

In some examples of the present disclosure, one or more fingers of an electrode of the self-routing capacitor 200 can be formed at the edge of a base region of the electrode. In other examples, one or more finger of an electrode can be formed a finite distance from an edge of a base region. The finger 225, for example, can be formed a distance D8 from an edge of the base region 210, where D8 can include any distance from zero nanometers (nm) to an indicated fraction or percentage of the length of the base region 210.

In some examples of the present disclosure, one or more fingers of an electrode of the self-routing capacitor 200 can be substantially aligned with an opposing finger of another electrode. Such substantial alignment can include a substantial overlap between a finger of one electrode and a finger of another electrode along an axis, such as the axis Y. The finger 220 of the electrode 235, for example, is substantially aligned with the finger 255 of the electrode 285. Such substantial alignment can also include a finite distance or rage of nonoverlap between two substantially aligned fingers. As an example, the finger 215 of the electrode 205 is substantially aligned with the finger 250 of the electrode 270, but such alignment includes a distance D11 of nonoverlap, where D11 can include any distance from zero up to an indicated fraction or percentage of the length of the base region 205 or a fraction of percentage of the length of the base region 275.

In some examples of the present disclosure, one or more electrode of the self-routing capacitor 200 can be substantially aligned with another electrode of the self-routing capacitor. Such substantial alignment can include a substantial overlap between base regions of two electrodes along an axis, such as the axis X or the axis Y. The electrodes 205 and 270 are substantially aligned due to their overlap in the axis X. Such substantial overlap can include a finite distance or range of nonoverlap between the base regions of two substantially aligned electrodes. The electrodes 285 and 235 are substantially aligned, but such alignment includes a distance or range D9 of nonoverlap between base regions 245 and 280 along the axis X and a distance or range D10 of nonoverlap between base regions 245 and 280 along the axis Y. The distance D9 can include any distance from zero up to an indicated a fraction of percentage of length of the base region 245 or a fraction of percentage of the length of the base region 280. The distance D10 can include any distance from zero up to and a fraction of percentage of width of the base region 245 or a fraction of percentage of the width of the base region 280.

Figure 3:
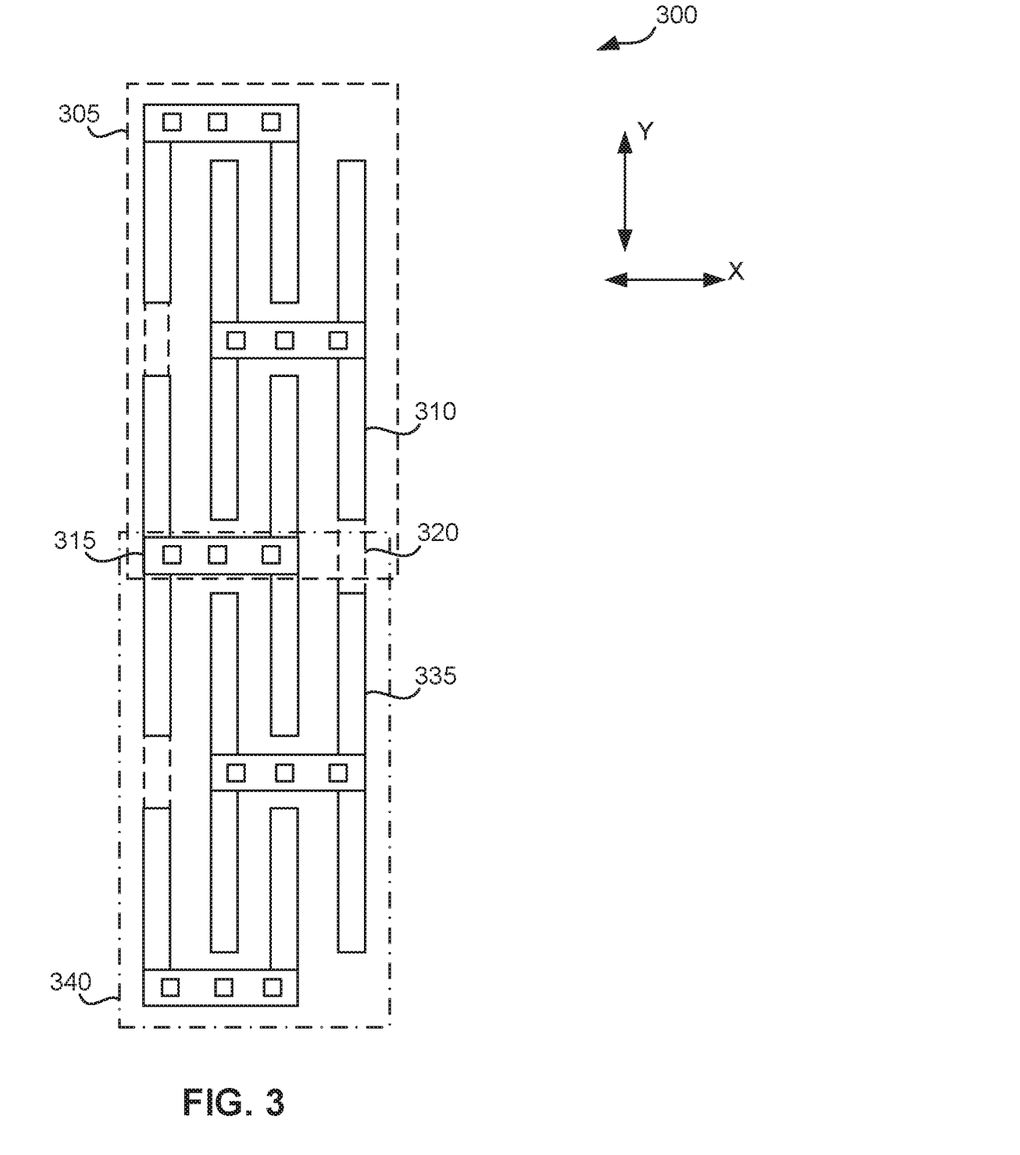
FIG. 3 illustrates an example of an expanded self-routing capacitor, according to an example of the present subject matter.

FIG. 3 illustrates an example of an expanded self-routing capacitor 300, according to an example of the present subject matter. The expanded self-routing capacitor 300 can include a first self-routing capacitor 305 and a second self-routing capacitor 340. As shown in FIG. 3, the self-routing capacitor 305 and the self-routing capacitor 340 can share a common base region 315, such as to form a single a plate (e.g., a bottom plate) of the expanded self-routing capacitor 300, such as when the self-routing capacitor 305 and the self-routing capacitor 340 are formed in the same metal layer. In some examples, the base region 315 can correspond to overlapping base regions of the self-routing capacitor 305 and the self-routing capacitor 340 in different metal layers, such as when the self-routing capacitor 305 and the self-routing capacitor 340 are formed in the in different metal layers. In some examples where the self-routing capacitor 305 and the self-routing capacitor 340 are formed in the same metal layer, finger 310 of the self-routing capacitor 305 can be coupled to finger 335 of the self-routing capacitor 340 in the same metal layer, such as by a conductor 320. The conductor 320 can be an extension of the finger 310 or an extension of the finger 335.

In some examples, the expanded capacitor 300 can be formed by substantially aligning the self-routing capacitor 305 and the self-routing capacitor 340, such as described in the discussion of FIG. 2. Such alignment can include configuring the self-routing capacitor 305 and the self-routing capacitor 340 to cause a base region of a bottom plate of the self-routing capacitor 305 to abut a base region of a bottom plate of the self-routing capacitor 340.

Figure 4:
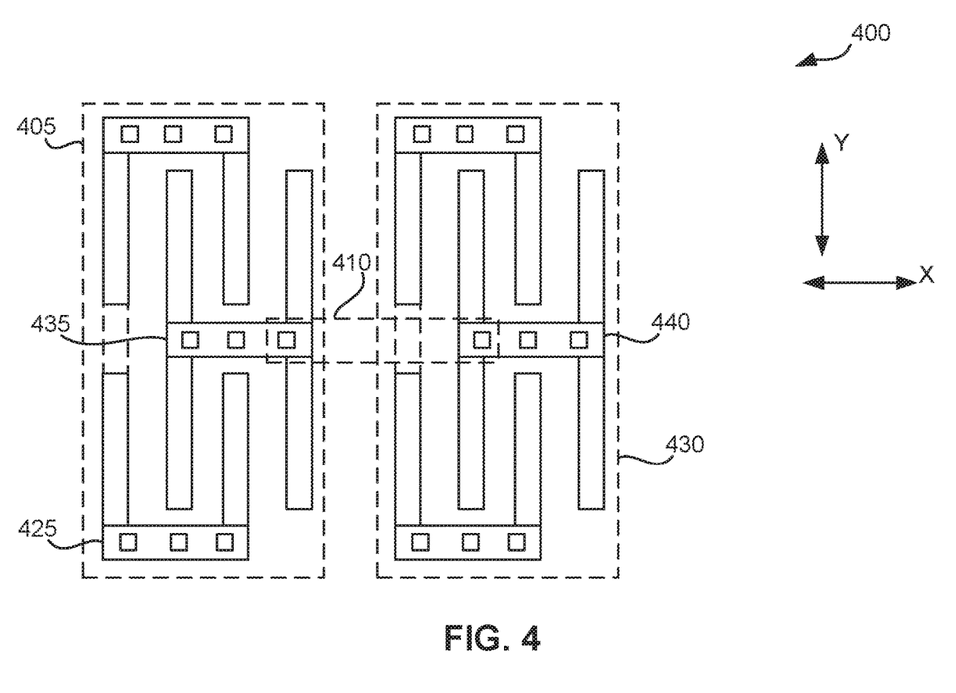
FIG. 4 illustrates an example of an expanded self-routing capacitor, according to an example of the present subject matter.

FIG. 4 illustrates an example of an expanded self-routing capacitor 400, according to an example of the present subject matter. The expanded self-routing capacitor 400 can include a first self-routing capacitor 405 and a second self-routing capacitor 430, each of which can be formed in the same metal layer or in different metal layers. As shown in FIG. 4, the self-routing capacitor 405 and the self-routing capacitor 430 can be coupled together at base regions 435 and 440, such as by the conductor 410. The conductor 410 can be an extension of the base region 435 or an extension of the base region 440. In some examples, the conductor 410 can be a conductor in a different metal layer than the metal layer in which the self-routing capacitor 405 or the self-routing capacitor 430 is formed. The self-routing capacitor 405 and the self-routing capacitor 430 can be substantially aligned, as described herein. Additionally, other base regions of the self-routing capacitor 405 and the self-routing capacitor 430 may be coupled.

Figure 5:
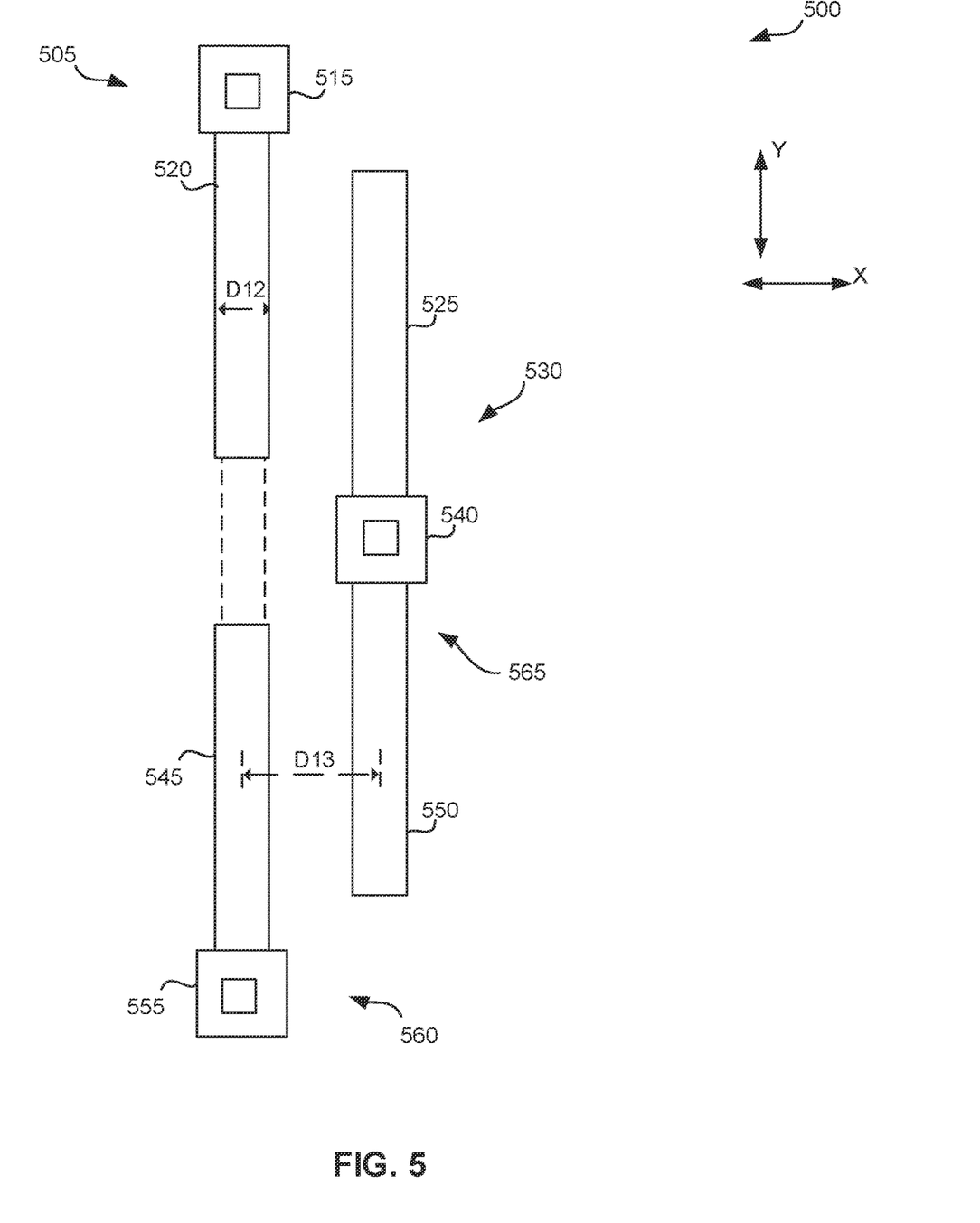
FIG. 5 illustrates an example of a self-routing capacitor, according to an example of the present subject matter.

FIG. 5 illustrates an example of a self-routing capacitor 500, according to an example of the present subject matter. The self-routing capacitor 500 can include a first electrode 505, a second electrode 560, a third electrode 530, and a fourth electrode 565. The first electrode 505 can include a base region 515 and a finger 520 extending in a first direction away from the base region 505. The second electrode 560 can include a base region 555 and a finger 545 extending in a second direction away from the base region 555. The third electrode 530 can include a third base region 540 and a third finger 525 extending in the second direction away from the third base region 540. The fourth electrode 565 can include a fourth base region (not shown) and a fourth finger 550 coupled to the fourth base region and extending in the first direction away from the fourth base region. In some examples the fourth finger 550 is coupled to the third base region 540 as part of the third electrode 530.

In some examples the third base region 540 can substantially overlap the fourth base region, such as along the axis X or the axis Y.

In some examples, the first electrode 505 (e.g., the finger 520) can substantially overlap, without touching, the third electrode 530 (e.g., the finger 525) along an axis Y that is substantially parallel to the first direction, while the second electrode 560 (e.g., the finger 545) can substantially overlap, without touching, the fourth electrode 565 (e.g., the finger 550) along the same axis.

As with the self-routing capacitor 100 (FIG. 1), fingers of the self-routing capacitor can be devoid of vias and can have a minimum width D12 indicated for a metal layer finger without vias. The self-routing capacitor 500 can be electrically coupled to layers or components of an integrated circuit through vias in the base regions of the electrodes of the capacitor, as described herein. The self-routing capacitor 500 can be electrically coupled to layers or components of an integrated circuit through metal layer connections in the metal layer in which the capacitor is formed.

In some examples, the finger 520 can be coupled to the finger 545, such as in the same metal layer in which the self-routing capacitor 500 is formed.

Figure 6:
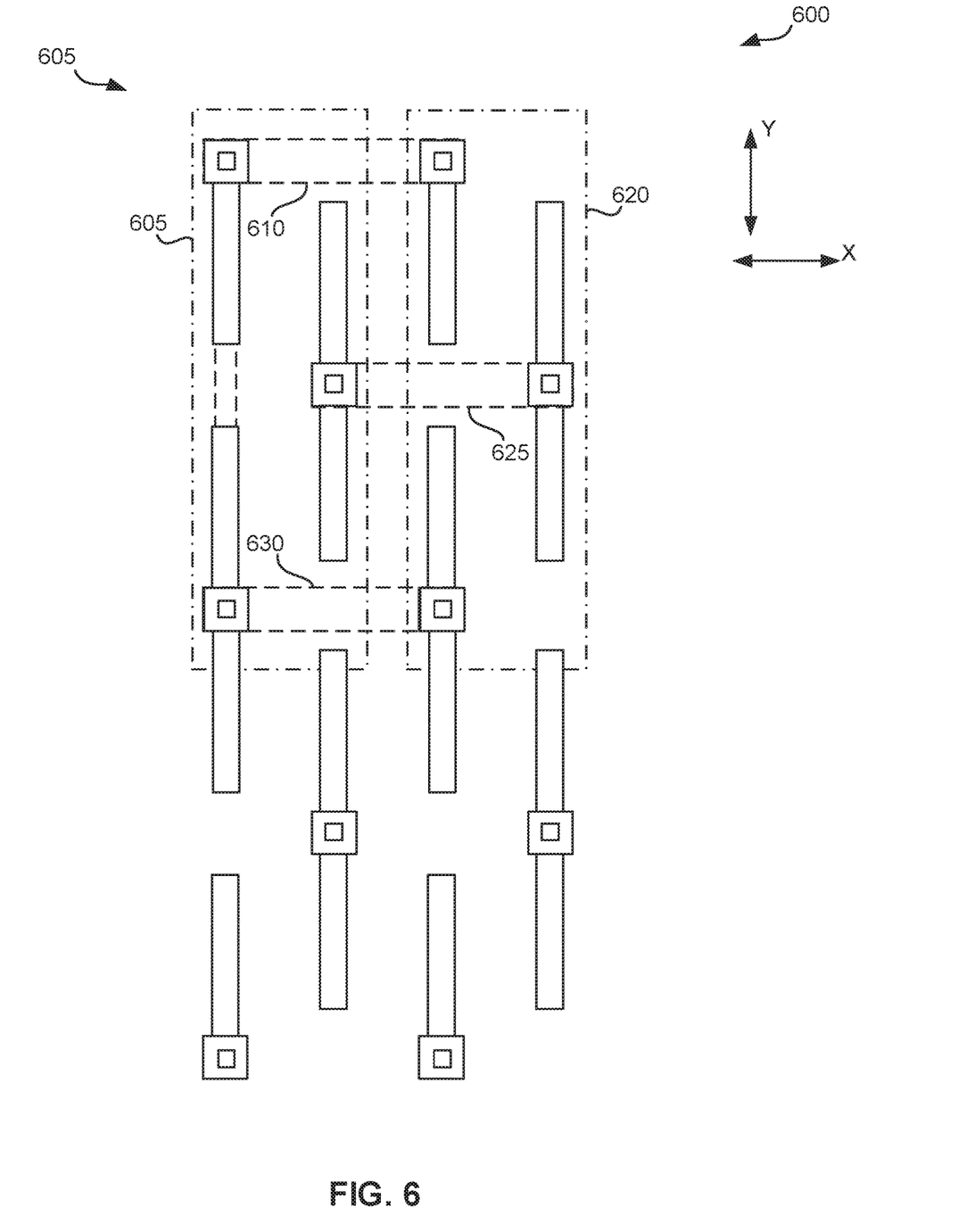
FIG. 6 illustrates an example of an expanded self-routing capacitor, according to an example of the present subject matter.

FIG. 6 illustrates an example of an expanded self-routing capacitor 600, according to an example of the present subject matter. The expanded self-routing capacitor 600 can include a first self-routing capacitor 605 and a second self-routing capacitor 620. In some examples, bottom plates of the self-routing capacitor 605 can be coupled to corresponding bottom plates of the self-routing capacitor 620 using conductors 610 or 630. Similarly, corresponding top plates of the self-routing capacitor 605 and the self-routing capacitor 620 can be coupled using conductor 625. Such conductors can be formed in the same metal layer in which the self-routing capacitor 605 or the self-routing capacitor 620 are formed or in a different metal layer.

Although FIG. 6 shows the self-routing capacitor 605 laterally coupled ng the axis X to the self-routing capacitor 620 to form the expanded self-routing capacitor 600, the expanded self-routing capacitor 600 can be formed by other configurations of self-routing capacitors. In some examples, the expanded self-routing capacitor 600 can be formed by substantially aligning two or more instances of the self-routing capacitor 605 or the self-routing capacitor 620 along an axis Y or an axis X, as described herein.

Figure 7:
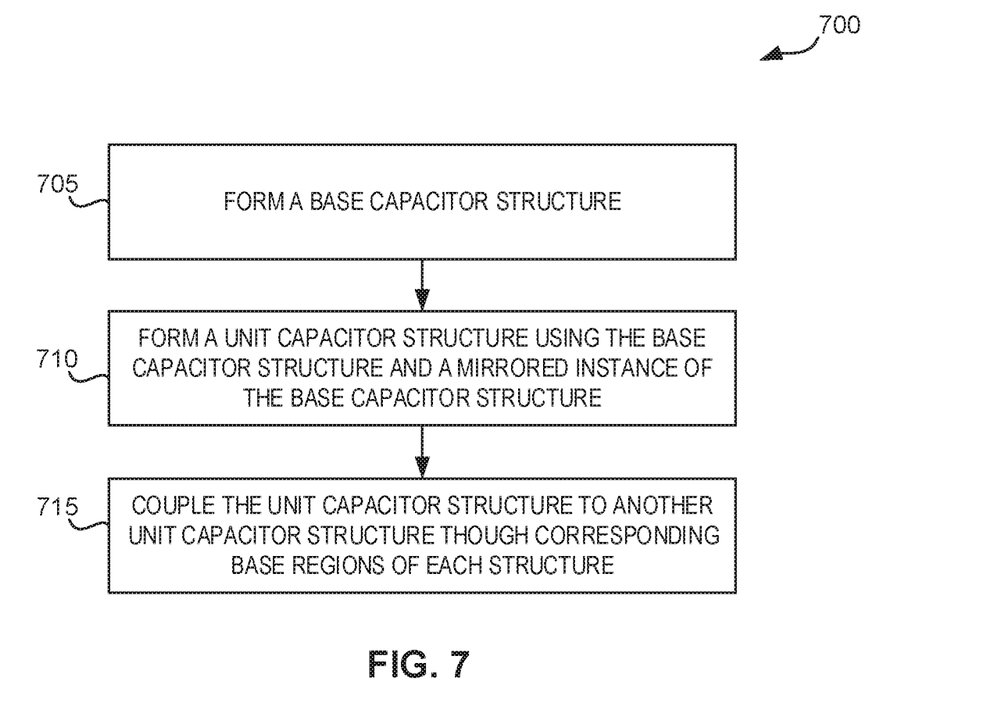
FIG. 7 illustrates an example of process for generating a self-routing capacitor, according to an example of the present subject matter.

FIG. 7 illustrates an example of process 700 for generating a self-routing capacitor, according to an example of the present subject matter. Such self-routing capacitor can be an example of one or more of the self-routing capacitors described the discussion of FIGS. 1-6. At 705, a base capacitor structure can be formed. The base capacitor structure can have a bottom plate including a first base region and a first set of two or more fingers. The base capacitor structure can also have a top plate including a second base region and a second set of two or more fingers. The second set of two or more fingers can be interdigitated with the first set of two or more fingers. At 710, a unit capacitor structure can be formed using the base capacitor structure and a mirrored capacitor structure. The mirrored capacitor structure can include an instance, or a copy, of the base capacitor structure that is mirrored, or flipped, across an axis that is substantially parallel to an axis long the length of the first base region. The base capacitor structure can be coupled to the unit capacitor structure, such as by coupling the second base region with a base region of a corresponding top plate of the mirrored capacitor structure.

In examples, forming the base capacitor structure includes forming a finger of the first set of two or more fingers or the second set of two or more fingers to have a minimum width allowed for an uncontacted finger in the metal layer.

In examples, forming the base capacitor structure includes forming interdigitated fingers of both the bottom plate and the top plate to have a minimum pitch allowed for uncontacted electrodes in the metal layer.

In examples, coupling the second base region to the corresponding base region of the top plate of the mirrored capacitor structure includes disposing the mirrored capacitor structure adjacent to the base capacitor structure to cause the second base region to abut the corresponding base region of the top plate of the mirrored capacitor structure.

In examples, the process 700 can include expanding a size of the capacitor by coupling a second unit capacitor structure to the previously formed unit capacitor structure by overlapping the first base region with a corresponding base region of a bottom plate of the second unit capacitor structure.

In examples, the process 700 can include expanding a size of the capacitor by coupling a second unit capacitor structure to the previously formed unit capacitor structure by disposing the second unit capacitor structure adjacent to the first unit capacitor structure to cause the first base region to abut a corresponding base region of a bottom plate of the second unit capacitor structure.

In examples, the process 700 can include coupling the capacitor to another component of the integrated circuit through contacts in one or more base regions of the unit capacitor structure or through contacts in one or more base regions of the mirrored capacitor structure.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein," Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like. The above description is intended to be illustrative, and not restrictive. For example, the above-described examples (or one or more aspects thereof) may be used in combination with each other. Other embodiments can be used, such as by, one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:
1. A self-routing capacitor for an integrated circuit, the self-routing capacitor comprising:
a first structure comprising:
a first electrode having a first base region and a first set of two or more fingers;

a second electrode having a second base region and a second set of two or more fingers, the second set of two or more fingers interdigitated with the first set of two or more fingers;

a third electrode having a third base region and a third set of two or more fingers, a finger of the first set of two or more fingers being coupled to a finger of the third set of two or more fingers; and a fourth set of two or more fingers that are coupled to a first wall of the second base region and interdigitated with the third set of two or more fingers.

2. The self-routing capacitor of claim 1, wherein the first set of two or more fingers are formed in a first metal layer and the finger of the first set of two or more fingers is coupled to the finger of the third set of two or more fingers through a second metal layer and the first and third base regions.

3. The self-routing capacitor of claim 1, wherein the self-routing capacitor is coupled to other layers of the integrated circuit through one or more of the first base region, the second base region, or the third base region.

4. The self-routing capacitor of claim 1, wherein the first set of two or more fingers are formed in a first metal layer and at least one finger in the first set of two or more fingers has a dimension that is substantially equal to a minimum size for a finger without a via in the first metal layer.

5. The self-routing capacitor of claim 1, wherein the self-routing capacitor further comprises:
a second structure that comprises an instance of the first structure, wherein the second electrode of the first structure is coupled to an electrode of the second structure.

6. The self-routing capacitor of claim 5, wherein the second electrode of the first structure is formed in a first metal layer and the second electrode of the first structure is coupled to the electrode of the second structure in the first metal layer.

7. The self-routing capacitor of claim 1, wherein the first electrode, the second electrode, the third electrode, and the fourth set of two or more fingers are formed in a first metal layer of the integrated circuit.

8. The self-routing capacitor of claim 1, wherein:
the second set of two or more fingers are formed on a second wall of the second base region; and
the second wall of the second base region opposes the first wall of the second base region.

9. The self-routing capacitor of claim 8, wherein each finger in the second set of two or more fingers is formed at substantially opposite ends of the first wall of the second base region.

10. A method for forming a self-routing capacitor in a metal layer of an integrated circuit, the method comprising:
forming a base capacitor structure having a bottom plate and a top plate, wherein:
the bottom plate has a first base region and a first set of two or more fingers;
the top plate has a second base region and a second set of two or more fingers, the second set of two or more fingers interdigitated with the first set of two or more fingers; and
forming first unit capacitor structure comprising the base capacitor structure and a mirrored capacitor structure, wherein:
the mirrored capacitor structure is a mirrored instance of the base capacitor structure, the second base region is coupled to a corresponding base region of a top plate of the mirrored capacitor structure that corresponds to the top plate of the base capacitor structure, and a finger of the first set of two or more fingers is coupled to a corresponding finger of a bottom plate of the mirrored capacitor structure.

11. The method of claim 10, wherein forming the base capacitor structure comprises forming a finger of the first set of two or more fingers or a finger of the second set of two or more fingers to have a minimum width allowed for an uncontacted finger in the metal layer.

12. The method of claim 10, wherein forming the base capacitor structure comprises forming interdigitated fingers of both the bottom plate of the base capacitor structure and the top plate of the base capacitor structure to have a minimum pitch allowed for uncontacted electrodes in the metal layer.

13. The method of claim 10, further comprising:
coupling the finger of the first set of two or more fingers to the corresponding finger of the bottom plate of the mirrored capacitor structure through the first base region and a corresponding base region of a bottom plate of the mirrored capacitor structure.

14. The method of claim 10, wherein coupling the second base region to the corresponding base region of the top plate of the mirrored capacitor structure comprises at least partially overlapping the second base region and the corresponding base region of the top plate of the mirrored capacitor structure.

15. The method of claim 10, wherein coupling the second base region to the corresponding base region of the top plate of the mirrored capacitor structure comprises:
disposing the mirrored capacitor structure adjacent to the base capacitor structure to cause the second base region to abut the corresponding base region of the top plate of the mirrored capacitor structure.

16. The method of claim 10, further comprising:
expanding a size of the self-routing capacitor by coupling a second unit capacitor structure to the first unit capacitor structure by overlapping the first base region with a corresponding base region of a bottom plate of the second unit capacitor structure.

17. The method of claim 10, further comprising:
expanding a size of the sell-routing capacitor by coupling a second unit capacitor structure to the first unit capacitor structure by disposing the second unit capacitor structure adjacent to the first unit capacitor structure to cause the first base region to abut a corresponding base region of a bottom plate of the second unit capacitor structure.

18. The method of claim 10, wherein the mirrored instance of the base capacitor structure is mirrored across an axis that is substantially parallel to a length of the first base region.

19. A capacitor formed in a metal layer of an integrated circuit, the capacitor comprising:
a first electrode comprising a first base region and a first finger that extends from the first base region in a first direction;
a second electrode comprising a second base region and a second finger, the second finger extending from a wall of the second base region in a second direction, the second finger coupled to the first finger;
a third electrode comprising a third base region and a third finger, the third finger extending from a first wall of the third base region in the second direction; and a fourth electrode comprising a fourth base region and a fourth finger, wherein: the fourth finger extends from a second wall of the fourth base region in the first direction;

wherein:

the first electrode at least partially overlaps the third electrode along an axis that is substantially parallel to first direction, and the second electrode overlaps the fourth electrode along the axis, and the capacitor is only coupled to other metal layers through a base region of an electrode of the capacitor.

20. The capacitor of claim 10, wherein the first electrode and the second electrode are formed in a first metal layer and the first finger is coupled to the second finger in a second metal layer using the first base region and the second base region.

21. The capacitor of claim 20, wherein the third base region overlaps the fourth base region along the axis that is substantially parallel to the first direction.

22. The capacitor of claim 20, wherein third base region overlaps the fourth base region along an axis that is substantially perpendicular to the first direction.

23. The capacitor of claim 19, wherein fingers of the capacitor do not include vias.

24. The capacitor of claim 19, wherein the second direction is substantially parallel to and opposes the first direction.

* * * * *